SEMICONDUCTOR DEVICE WITH AUTOMATIC GAIN CONTROL

Filed Dec. 5, 1962

INVENTOR.
John C. Haenichen

BY Mueller & Aichele 3,373,324

SEMICONDUCTOR DEVICE WITH AUTOMATIC GAIN CONTROL

John C. Haenichen, Scottsdale, Ariz., assignor to Motorola, Inc., Chicago, Ill., a corporation of Illinois Filed Dec. 5, 1962, Ser. No. 242,466
8 Claims. (Cl. 317—235)

This invention relates in general to semiconductor devices and in particular to semiconductor devices for automatic gain control purposes.

High frequency semiconductor devices featuring automatic gain control (AGC), as for example an AGC transistor having properties such that power gain can be varied by changing some DC characteristic of the transistor in its circuit, are finding increased use in transistorized circuits. High frequency AGC transistors may be used to advantage in radios, television receivers, and similar electronic apparatus employing transistors as high frequency amplifiers that are subject to variation in incoming signal strength as a result of location of the receivers and the location of the transmitter, changes in atmospheric conditions, and other fluctuating conditions which may vary the strength of the signal. It is desirable if the gain of the transistor and therefore of the amplifier in which it is used can be varied with the varying input signals in such a way that the output of the amplifier is essentially constant. This characteristic is desirable and often essential in that the function of receivers such as television and radio receivers is to supply information either by way of a picture tube or loudspeaker, and if the strength of the signal reaching either varies the effect may be to render the output picture or sound unpleasant or useless. The sound can vary from very loud to inaudible and a television picture can vary from bright to black, for example, when the gain is not properly controlled.

At the present state of the art, high frequency semiconductor devices having internal means for increasing amplification when the strength of the incoming signal drops or decreasing amplification when the strength of the incoming signal rises, thereby providing AGC action, have not been entirely satisfactory. One known type of AGC transistor is provided with heavy emitter and collector doping and with a lightly doped wide base area which is easily depleted. Such transistors are usually operated to provide what is called reverse AGC (i.e., an increase in power gain with the increase of some DC parameter of the transistor). This is a somewhat undesirable way to achieve AGC since in the presence of large signals the operating point on the dynamic range of the device is shifted to an area where large signals will be clipped and distorted. Further, in adapting such devices to high frequency use, the resultant structure inherently has severe thermal limitations such that it is subject to destruction upon overload. Devices of this type are expensive to fabricate and not easily produced on a large-scale basis. For example, in the most commonly used device the base width is determined by an etching rather than a diffusion process, making control and reproducibility difficult.

Other known AGC transistors are provided with light collector doping to induce depletion layer shift and base widening with the change of a DC parameter. With such a device it is possible to provide forward AGC when operated at the higher frequencies in the range where power gain falls off with frequency at approximately a constant rate. The power gain in this range is related to $f_{max}$, the maximum frequency at which the transistor will oscillate. The frequency $f_{max}$ is proportional to the square root of the value of the gain bandwidth frequency $f_T$ divided by the product of the base resistance and the collector capacitance of the transistor. The gain bandwidth frequency $f_T$ is by definition the frequency at which the common emitter current gain is equal to unity. The value of $f_T$ has an inverse relationship to the capacitance of the emitter-base junction, the current dependent resistance of the emitter-base junction and especially to the base transport time which rapidly increases with increases in the effective base width.

The effective base width of transistors of this type becomes wider with increased current density due to a change in charge distribution in the lightly doped base collector region, resulting in an increase in base transport time across the widened base to cause a fall in $f_T$ and, therefore, in $f_{max}$. This reduces power gain since reducing $f_{max}$ changes the location of an operating point on the power gain versus frequency curve in such a way that the same typical operating frequency intersects the curve at a new point corresponding to a lower power gain. The degree of AGC sensitivity exhibited by a transistor of this type depends primarily on the level of doping of the collector and base regions. With light doping $f_{max}$ and therefore power gain falls rapidly with increased current so that the device can be constructed with good AGC characteristics. However, as is well-known, transistors having lightly doped or highly resistive base and collector regions have low peak power gain and this works at a severe disadvantage in high frequency, low signal applications where it is desirable to maximize the signal-to-noise ratio.

Accordingly, it is a general object of the invention to provide a semiconductor device with improved small signal AGC chaarcteristics without degrading peak power gain.

Another object is to provide an improved AGC transistor having excellent forward AGC characteristics without sacrificing signal-to-noise ratio.

A further object is to provide an AGC transistor which exhibits a sharp decrease in power gain in response to increased current after a predetermined maximum power gain is reached.

A more specific object of the invention is to provide a planar silicon transistor having improved AGC characteristics.

Among the features of the present invention is the provision of a transistor with an emitter which has decreasing minority carrier injection with increasing current to provide AGC action at and beyond the point of peak power gain.

Another feature is the provision of a transistor with an emitter ohmic contact having a relatively small area with respect to the area of the emitter region so that a lateral biasing effect takes place with increased current to decrease minority carrier injection at points remote from the area of ohmic contact, allowing sharp AGC characteristics to be realized without limiting available peak power gain.

Still another feature of the invention is the provision of an AGC transistor with an emitter ohmic contact having an area which is substantially less than the area of the emitter region and a surface resistivity which is substantially less than the sheet resistivity of the emitter region. Increased current results in higher current density in portions of the emitter region close to the area of ohmic contact so that improved AGC characteristics can be realized without limiting peak power gain.

Another feature of the invention is the provision of an AGC transistor having a structure which may be economically fabricated with a high degree of reproducibility, and which may be readily tailored to match a given AGC curve.

Other objects, features and attending advantages of the invention will become apparent from the following description when taken in conjunction with the accompanying drawings, in which.

In accordance with the invention, planar and other transistor types are adapted to exhibit current sensitive AGC action by making use of the fact that emitter injection depends on the degree to which the emitter is forward biased. An emitter region is provided which has a relatively high sheet resistivity in a lateral direction from a relatively small-area contact point at which a forward biasing voltage is supplied. Accordingly, the forward bias with respect to distance from the contact area will fall as the emitter current is increased due to increased IR drop across the more remote points of the emitter region. This results in emitter regions remote from the contact point being at a lower forward bias than emitter regions nearer to the contact point. Injection is less at these remote regions due to the reduced bias, and increased current density occurs at areas close to the emitter ohmic contact area to result in a reduction of $f_{max.}$ and hence a decrease in power gain in the region of the power gain versus frequency curve where $f_T$ falloff occurs.

In the usual mesa or planar transistor, ohmic contact is made with as large an area as possible of the emitter region with a highly conductive metal so that there is little or no voltage gradient or IR drop from the point at which a lead wire is bonded to the ohmic contact and other points of the emitter region under the area of ohmic contact. This is desirable in conventional transistors since the injection capability of an emitter varies with the biasing voltage and at a given temperature can be considered proportional to $e^{(qV/kT)}$, where $e$ is the natural logarithm base, V is the biasing voltage, $q$ is the charge of an electron, T is temperature in degrees Kelvin and $k$ is Boltzmann's constant. The ratio $kT/q$ is constant for a given temperature, typically 26 millivolts at 25° C. By making the effective average value of V decreases with increased current flowing from the ohmic emitter contact, it is possible to cause the injection capability of the transistor to diminish exponentially, with a corresponding decrease in power gain and hence forward AGC action after a fixed value of V determinative of maximum power gain has been overcome.

Figure 1:
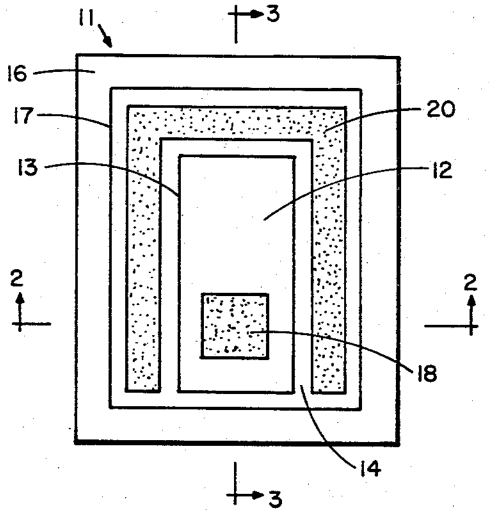
FIG. 1 is a top view of a planar transistor showing an embodiment of the emitter structure of the invention.
Figure 2:
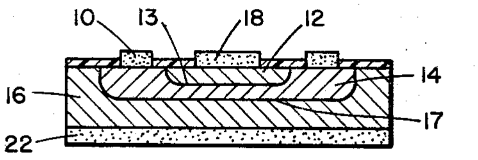
FIG. 2 is a sectional view of the transistor of FIG. 1 taken along lines 2—2.
Figure 3:
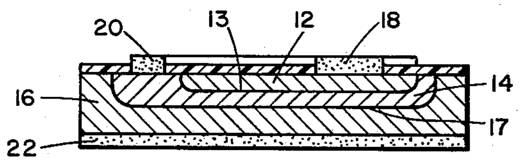
FIG. 3 is a sectional view of the transistor of FIG. 1 taken along lines 3—3.

Referring now to FIGS. 1–3, transistor 11 includes three regions of alternately opposite conductivity semiconductor material in the conventional manner. The regions may be germanium or silicon and the transistor may be either of the PNP or NPN type. For illustrative purposes only transistor 11 will be considered a planar PNP silicon transistor. It is to be further understood that the particular configuration shown is not limited to that shown, and invention may be practiced with diffused junction and mesa transistors of known types. The various semiconductor regions and associated ohmic contacts may be star shaped or generally rectangular or circular, usually concentrically disposed by diffusion in a semiconductor body.

Emitter region 12 forms a first junction 13 with base region 14, of opposite conductivity. Similarly, collector region 16 forms a second junction 17 with base region 14. Metallic contact 18, which may be provided by metallizing in the known manner and of low resistivity, provides an ohmic contact with a portion of emitter region 12. Metallic contacts 20 and 22 provide ohmic contact with substantially larger portions of the base and collector regions. A passivating film of glass or silicon dioxide 15 covering the junctions 13 and 17 tends, as is well-known, to reduce the noise level of the transistor.

It is to be noted that while the ohmic contacts provided for the base and collector regions cover, insofar as practical, substantially the entire area of such regions, the emitter ohmic contact covers only a relatively small area of the emitter region. Preferably the emitter ohmic contact is asymetrically located on the surface area of the emitter region, as for example at one end of the elongated rectangular emitter region of the transistor illustrated in FIG. 1.

When a biasing voltage is applied to the device at metallized contact 18 and there is little or no current flow through emitter region 12, emitter-base junction 13 is everywhere at essentially the same potential. However, as more and more current flows through the emitter region, the sheet resistance of the emitter region (i.e., the resistance of areas of unit thickness), extending from contact area 18, produces an IR drop over the emitter region proportional to $e^{(qV/kT)}$ so that at room temperature the number of carriers injected falls approximately by a factor $e$ for each 26 millivolts that the biasing potential is reduced by such IR drop. Thus, different portions of the emitter region are subjected to a bias voltage which becomes smaller with increasing distance from metallized contact 18, with the IR drop for any given distance from contact 18 increasing with increasing current.

Figure 4:
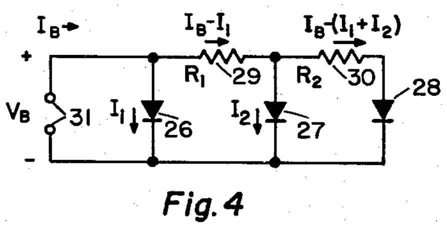
FIG. 4 is a diagram of an equivalent circuit illustrating the manner in which the transistor of the present invention produces the desired AGC action.

The transistor emitter-base junction may be compared in a non-rigorous manner to a wafer of semiconductor material having a number of PN junctions thereon. Consider a device having three junctions resistively joined, and represented schematically as three forward biased diodes 26, 27 and 28 connected by resistors 29 and 30, representing the sheet resistance of emitter region 12, as shown in FIG. 4. At a given bias $V_B$ appearing at terminals 31, the first diode or junction 26 is conducting essentially by minority carrier current flow according to $e^{(qV_B/kT)}$. Since the surface of ohmic contact 18 is everywhere at equal potential, no resistance connects terminals 31 to diode 26. If the total current flowing due to $V_B$ is $I_B$ and the current flowing through the first junction 26 is $I_1$, then the current flow through the resistor 29 of value $R_1$ is $I_B - I_1$, and the voltage drop across this resistor is $(I_B - I_1)R_1$ or $V_1$. Junction 27 is then conducting according to $e^{q}(V_B - V_1)/kT$. If current flowing through the junction 27 is $I_2$, then the current flowing in the resistor 30 of value $R_2$ will be $I_B - (I_1 + I_2)$ and the voltage drop across this resistor will be $[I_B - (I_1 + I_2)]R_2$ or $V_2$. Junction 28 is then conducting according to $$e^{q}[V_B - (V_1 + V_2)]/kT$$

If the biasing voltage $V_B$ is maintained constant and the current flow $I_B$ is greatly increased, $V_1$ and $V_2$ are correspondingly increased. Although the conduction of the first junction 26 is unchanged, the second junction 27 has a smaller biasing voltage and is able to conduct less, and the third junction 28 has a much smaller bias and is, therefore, able to conduct much less. This action continues until there is less bias on the third junction 28 than is required to support any forward conduction other than leakage, and only the first and second junctions 26 and 27 are conducting. Still further increases in current will also render the second junction non-conductive, with only the first junction representing the area near the low resistivity ohmic contact conducting.

In the actual device the number of junctions (i.e., emitters) is infinite and the resistances between are incremental so that the total emitter junction becomes progressively less emissive with increased current, and although the applied forward bias may be unchanged, the average forward bias for the emitter considered as a whole becomes smaller so that the general efficiency of the emitter as a minority carrier injector appears to fall continuously with increased current. If each of the infinitesimal junctions is considered as an emitter of a separate infinitesimal transistor, then when a fairly high current flows into the metal emitter contact of the total AGC transistor, those infinitesimal transistors furthest from the contact are inactive since the forward bias is too small for transistor action and thus do not provide gain; those transistors lying somewhat closer to the contact but having a low bias will have low gain due to the normal relatively low ratio of emitter current to base current under low bias conditions; and those devices nearest the contact where the bulk of the AGC transistor emitter current flows will be operating at high injection levels due to the very high current density so that they too have reduced gain since, at high injection levels, the emitter efficiency has a functional dependence on current such that it decreases as emitter current increases but more importantly for high frequencies, the base transit time for these transistors is increased due to a slight increase in the effective base width with the increased current density, causing a decrease in $f_T$ and $f_{max}$ and, therefore, in the power gain value at the high frequency operating point.

With a collector connection common to all of the devices, the actual device gain would be some average value of all of the gains of these devices. The effect of large junction capacitances and a high base resistance on a transistor is to limit its high frequency power gain and all of the infinitesimal devices including those which are inoperative contribute their capacitances to the total transistor, and the effective base resistance of the total transistor will eventually become higher with higher current. Since a region of the base adjacent a region of the emitter rendered non-operating by low bias will carry little current, the effect is somewhat analagous to actually switching out or removing one of several paralleled resistors thereby increasing the aggregate resistance of those remaining. Power gain, especially at high frequencies, falls continuously with increasing emitter current due to all of the factors considered and thus the device exhibits a pronounced AGC characteristic.

AGC achieved with transistors in the previously described manner does not require very low impurity concentrations at the collector-base junction region and since the AGC effect is very slight at moderate current, where peak gain occurs, the operation of the device is such that the peak gain is essentially that of transistors featuring little AGC action. At high current levels both $f_T$ falloff and increased base resistance result in a decrease in $f_{max}$ to produce desired AGC action. This does not occur, however, until after peak power gain has been obtained, as determined by peak $f_T$.

Figure 5:
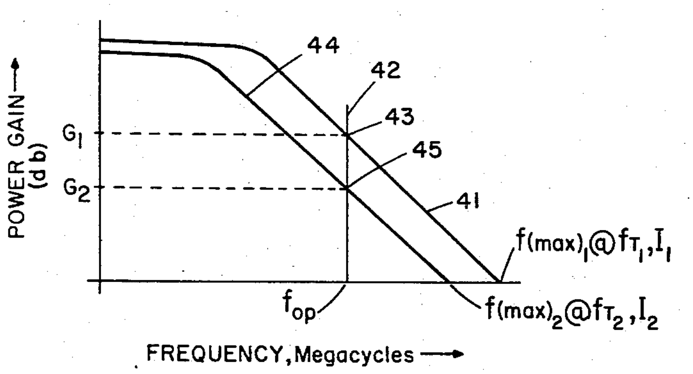
FIG. 5 is a graph of two curves of power gain versus frequency for a transistor at two different values of emitter current.
Figure 6:
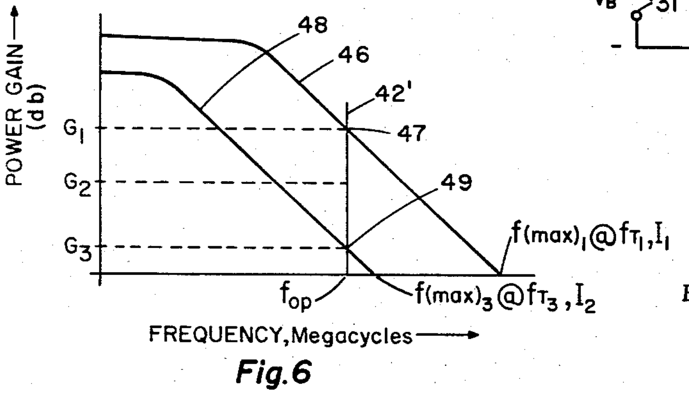
FIG. 6 is a graph of two curves of power gain versus frequency under the same operating conditions for a transistor according to this invention.

FIGS. 5 and 6 compare for the same operating conditions the action of the AGC transistor of FIGS. 1–3 as compared to the same device having a fully metallized emitter. The action of the device having the fully metallized emitter is shown first in FIG. 5.

In FIG. 5 are shown two curves of power gain versus frequency for two different operating levels of emitter current $I_1$ and $I_2$ for the device having the fully metallized emitter. In the first curve 41 for emitter current $I_1$, the current corresponding to the peak value $f_{T_1}$ of gain bandwidth intersects the frequency axis at the peak value $f_{(max)_1}$ of the maximum frequency of oscillation. The vertical line 42, the value of the typical operating frequency, intersects the curve 41 at a point 43 corresponding to a power gain value $G_1$ which is the peak power gain for the device at $f_{op}$. With increased emitter current so that gain bandwidth falls off to a value $f_{T_2}$ less than $f_{T_1}$, a new power gain versus frequency curve 44 is required to characterize the device. This new curve 44 for $I_2$ greater than $I_1$ has essentially the same slope in the operating region as the first curve 41 but it has a lower maximum frequency of oscillation $f_{(max)_2}$ since $f_{T_2}$ is less than $f_{T_1}$. The position of the sharply sloping portion of the curve 44 now causes it to be intersected at the same typical operating frequency $f_{op}$ at a point 45 corresponding to a lower gain $G_2$. With emitter current varying to cause $f_T$ to vary between $f_{T_1}$ and $f_{T_2}$, for example, the power gain varies between $G_1$ and $G_2$ at the same operating frequency and some AGC action is achieved.

In FIG. 6, two curves of power gain are shown for an AGC device having a partially metallized emitter contact as in FIGS. 1–3. These curves are for the same emitter current values $I_1$ and $I_2$ as for the device of FIG. 5. The first curve 46 of this figure, for emitter current $I_1$, is almost identical with the curve for $I_1$ of FIG. 5. The curve 46 intersects the frequency axis at essentially the same value $f_{(max)_1}$ as in FIG. 5 since gain bandwidth $f_T$ has almost ahe same value $f_{T_1}$ as before. The typical operating frequency $f_{op}$ intersects this curve 46 at the point 47 corresponding to the same peak gain $G_1$. When the emitter current is increased to $I_2$ and the more remote regions of the emitter become inoperative, then the operating portions of the emitter must carry a larger share of the current and the current density is much greater in the operating regions of the emitter, base and collector of the device so that gain bandwidth falls to $f_{T_3}$ a much lower figure than $f_{T_2}$. There is also an increase in the base resistance of the device to augment the action of current on $f_{(max)}$, and thus the new curve 48 for $I_2$ intersecting the frequency axis at a much lower maximum frequency of oscillation $f_{(max)_3}$ describes the transistor. The line 42′ for operating frequency $f_{op}$ intersects this curve 48 at the point 49 representing a value of power gain $G_3$ much smaller than $G_2$. Thus, for the same change in current from $I_1$ to $I_2$, the transistor of this invention will vary in power gain over a much wider range so that the AGC action of this device is much more pronounced due to the emitter design.

Although the device just described demonstrated considerable AGC action at the higher operating frequencies, it is also suitable for low frequency AGC. Inspection of FIG. 6 indicates that the curves for the two emitter current conditions also intersect the power gain axis at more widely spaced points than do the curves of FIG. 5. This is due in part to the decrease in emitter efficiency at very high current levels and to the biasing effect inducing changes away from an optimum geometry since the emitter is effectively reduced in size. These changes jointly reduce the current gain of the device and thereby the power gain falls with increased emitter current since the power gain varies as the square of the current gain. While current gain has a minor effect at very high frequencies where its value is small, it is large at the lower frequencies, and therefore, small changes in current can appreciably vary the low frequency power gain of the device.

A particularly successful operating silicon planar transistor similar to that shown in FIGS. 1–3 and suitable for AGC at high frequencies in the range from 20 to 100 megacycles per second has a boron diffused P-type emitter 10 mils long by 2 mils wide by 2 microns deep, suitably doped to provide a sheet resistance of 2.5 ohms per square. The emitter contact, which is alloyed to the P-type silicon, is centered at one end of the emitter and lies about 0.5 mil in from the end. It is 1.0 mil square and is of 10,000 angstrom units thick aluminum. The N-type base is phosphorous diffused and is 13 mils long by 6.5 mils wide by 2.7 microns deep, and has a sheet resistance of 70 ohms per square. The base metallizing lies alongside three edges of the emitter-base junction, separated therefrom by a distance of about 0.5 mil. This contact metal is also about 10,000 angstrom units thick aluminum alloyed to the silicon and is about 0.75 mil wide. The base is heavily N doped in the contact region so that a PN junction is not formed. The collector region is about 25 mils long by 25 mils wide by 6 mils thick. It is metallized with a gold-boron alloy across the bottom surface of less than 1 mil thickness for making electrical contact to the collector. The thermally grown passivating film of silicon dioxide or glass is 1 to 2 microns thick. Devices of this and other basic geometries are easily made having relatively more or less AGC action simply by changing the size of the metal emitter contact and are easily adapted for higher or lower frequency applications by simply scaling the device geometry down or up.

While most transistors exhibit some tendency for the power gain to vary with current, this tendency is greatly increased by the design of this AGC transistor. In general, if the following empirical relationships are observed, the transistor will have a very pronounced and well controlled AGC action with varying emitter current. The emitter region should be at least five times longer than wide, at least fifty times longer than thick and should have a sheet resistivity in the order of 2.5 ohms per square or more. The metal electrical contact in connection with the emitter should have a sheet resistivity of less than .025 ohm per square or less than 0.01 times that of the emitter region, occupying twenty percent or less of the outer emitter region surface area (if the device is passivated, this would include the area lying under the film of silicon dioxide and glass), and should be located at one end of the long axis of the emitter regions. The base region should have a sheet resistivity in the order of 80 ohms per square. The metal contact to the base should have a sheet resistivity not over 0.01 times that of the base region and should extend about three sides of the emitter as shown. The stoichiometric base-collector junction should have a rather shallow gradient which should be in the range of $10^{19}$ atoms per cubic centimeter per centimeter to $2\times10^{20}$ atoms per cubic centimeter per centimeter. Since passivated transistors are less noisy as a rule, for the highest signal-to-noise ratios, passivated AGC transistors are most useful.

Transistors made according to this invention provide all that is necessary for excellent AGC action, including for small signal use, a very low noise characteristic in the case of passivated planar transistors, and do so without degrading any desirable operating parameters.

I claim:

1. In a high frequency transistor including emitter, base and collector regions and having a power gain which is related to the maximum frequency at which the high frequency transistor will oscillate, the maximum frequency at which the transistor will oscillate being proportional to the square root of the value of the frequency at which the transistor current gain is unity divided by the product of the resistance of the base region and the capacitance of the collector region, the improvement comprising, a body of semiconductor material including said emitter region, said emitter region forming a planar rectifying junction within said semiconductor material and having an exposed major surface, and contact means operatively connectable to a source of high frequency signals, said contact means including a metallic conductor making ohmic contact with said emitter region in a contact area which is substantially less than the exposed area of said major surface for simultaneously causing a decrease in said frequency at which said high frequency transistor current gain is unity and an increase in said base resistance as the current through said contact means is increased, thereby decreasing said maximum frequency at which said high frequency transistor will oscillate.

2. In a high frequency transistor including emitter, base and collector regions and having a power gain which is related to the maximum frequency at which the high frequency transistor will oscillate, the maximum frequency at which the high frequency transistor will oscillate being proportional to the square root of the value of the frequency at which the transistor current gain is unity divided by the product of the resistance of the base region and the capacitance of the collector region, the improvement comprising, a body of semiconductor material including said emitter region, said emitter region forming a planar rectifying junction within said semiconductor material and having an exposed major surface substantially parallel to said junction, and contact means operatively connectable to a source of high frequency signals, said contact means including a metallic conductor making ohmic contact with said emitter region in a contact area which is substantially less than the area of said exposed major surface for simultaneously causing a decrease in said frequency at which said transistor current gain is unity and an increase in the resistance of said base region as the current through said contact means is increased, thereby decreasing the maximum frequency at which said high frequency transistor will oscillate.

3. The transistor of claim 2 wherein the resistivity of said emitter region is at least 2.5 ohms per square, and the resistivity of said metallic contact area of said conductor is less than .025 ohm per square.

4. A high frequency semiconductor device having a power gain which is related to the maximum frequency at which the high frequency semiconductor device will oscillate, said semiconductor device including in combination, a body of semiconductor material having a plurality of regions of alternate opposite conductivity type, each said region forming a large area of rectifying junction with adjacent regions internally of said body and having a major surface exposed externally of said body, electrode means forming an ohmic contact with substantially the entire exposed major surface of at least two said regions, an electrode means providing for carrier injection forming an ohmic contact with the exposed major surfaces of one other region, with last said electrode means providing an area of ohmic contact which is small relative to the exposed major surface of the region for simultaneously causing a decrease in the frequency at which the current gain in said semiconductor device is unity and an increase in the resistance in one of said plurality of regions as the current through said last electrode means is increased, thereby diminishing carrier injection at points remote from said area of ohmic contact and decreasing the maximum frequency at which said semiconductor device will oscillate.

5. A high frequency semiconductor device including in combination a body of semiconductor material having first, second and third regions of alternate opposite conductivity types, said semiconductor device having a power gain which is related to the maximum frequency at which said semiconductor device will oscillate and said maximum frequency being proportional to the square root of the value of the frequency at which the current gain through said semiconductor device is unity divided by the product of the resistance of said second region and the capacitance of said first region, said region forming planar junctions with adjacent regions within said body and having parallel major surfaces exposed externally of said body, first and second metal contact means forming an ohmic contact with substantially the entire exposed major surfaces of said first and second regions, and third metal contact means forming an ohmic contact with the exposed major surface of the third region, said third metal contact means providing an area of ohmic contact which is small in relation to the exposed major surface of the third region for simultaneously causing a decrease in the frequency at which said current gain of said semiconductor device is unity and an increase in the resistance of said second region as current through said third metal contact means increases, and said third region having a resistivity substantially greater than the resistivity of the contact surface of said third metal contact means, whereby minority carrier injection is diminished in portions of said third region remote from said third ohmic contact area.

6. A high frequency semiconductor device including in combination, a body of semiconductor material having emitter, collector and base regions, said semiconductor device having a power gain which is related to the maximum frequency at which said semiconductor device will oscillate and said maximum frequency being proportional to the square root of the value of the frequency at which the current gain of said semiconductor device is unity divided by the product of the resistance of said base region and the capacitance of said collector region, said regions forming rectifying junctions with adjacent regions within said body and having major surfaces exposed externally of said body, collector and base electrode means making ohmic contact with substantially the entire exposed major surfaces of said collector and base regions, and emitter electrode means forming an ohmic contact with the exposed major surfaces of the emitter region, said emitter electrode means providing an area of ohmic contact which is small in relation to the exposed major surface of said emitter region for simultaneously causing a decrease in said frequency at which said current gain of said semiconductor device is unity and an increase in said resistance of said base region as the current through said emitter electrode means is increased, and with the emitter region having a resistivity of at least 2.5 ohms per square and the resistivity of the contact surface of said emitter electrode being at least an order of magnitude less than the resistivity of said emitter region, whereby carrier injection of said emitter electrode is effectively diminished in portions of said emitter region remote from said emitter ohmic contact area.

7. In a high frequency transistor of the type having contiguous emitter, collector and base regions forming two planar junctions, said high frequency transistor having a power gain which is related to the maximum frequency at which said high frequency transistor will oscillate and said maximum frequency being proportional to the square root of the value of the frequency at which transistor current gain is equal to unity divided by the product of the resistance of said base region and the capacitance of said collector region, said transistor having a predetermined peak gain for small signal operation, an emitter electrode including metallic ohmic contact means connected to a surface of said emitter region for providing minority carrier injection and for simultaneously causing a decrease in the frequency at which the transistor current gain is equal to unity and an increase in the resistance of said base region as current in said contact means is increased, said ohmic contact means being substantially less than the available carrier injection area of said emitter region so that for a predetermined emitter bias voltage carrier injection is substantially uniform over said emitter region at small signal levels, with carrier injection being substantially reduced over areas of said emitter region remote from said ohmic contact means at increased signal levels, whereby power gain is decreased in response to currents exceeding those providing maximum power gain.

8. In a high frequency semiconductor device of the type having contiguous emitter, collector and base regions forming two planar junctions, said semiconductor device having a power gain which is related to the maximum frequency at which said high frequency transistor will oscillate and wherein said maximum frequency is proportional to the square root of the value of the frequency at which the current gain in said semiconductor device is unity divided by the product of the resistance of said base region and the capacitance of said collector region, a generally rectangular emitter region having a conductivity to produce a predetermined peak power gain for small signal operation, metallic ohmic contact means connected to a surface of said emitter region for simultaneously causing a decrease in the frequency at which the current gain in said semiconductor device is unity and an increase in the resistance of said base region as the current in said metallic ohmic contact means is increased, said ohmic contact means asymmetrically located on the surface of said emitter region and of an area substantially less than the available carrier injection area of said emitter region, so that for a given emitter biasing voltage carrier injection is substantially uniform over said emitter region for small emitter currents, with carrier injection being substantially reduced over areas of said emitter region remote from said ohmic contact means at emitter current levels exceeding those producing maximum power gain, whereby power gain is substantially decreased to provide automatic gain control action.

References Cited

UNITED STATES PATENTS

| | | | |
|---|---|---|---|
| 3,025,589 | 3/1962 | Hoerni | 29—25.3 |
| 3,204,321 | 9/1965 | Kile | 29—25.3 |
| 3,206,827 | 9/1965 | Kriegsman | 29—25.3 |
| 3,312,162 | 10/1965 | Moore | 29—25.3 |
| 3,214,652 | 10/1965 | Knowles | 317—235 |

JOHN W. HUCKERT, *Primary Examiner.*

DAVID J. GALVIN, *Examiner.*

J. R. SHEWMAKER, *Assistant Examiner.*